United States Patent [19]

Nakamura et al.

[11] Patent Number: 4,609,844

[45] Date of Patent: Sep. 2, 1986

[54] PIEZOELECTRIC VIBRATOR

[75] Inventors: Takeshi Nakamura, Uji; Ikuo Matsumoto, Nagaokakyo, both of Japan

[73] Assignee: Murata Manufacturing Co., Ltd., Nagaokakyo, Japan

[21] Appl. No.: 761,397

[22] Filed: Aug. 1, 1985

[30] Foreign Application Priority Data

Aug. 10, 1984 [JP] Japan ................................ 59-168678

[51] Int. Cl.$^4$ ............................................ H01L 41/08
[52] U.S. Cl. ....................................... 310/321; 310/348; 310/368
[58] Field of Search ................. 310/321, 324, 348, 368

[56] References Cited

U.S. PATENT DOCUMENTS

| | | | |
|---|---|---|---|
| 4,350,918 | 9/1982 | Sato | 310/348 |
| 4,433,264 | 2/1984 | Nishiyama et al. | 310/321 |
| 4,443,728 | 4/1984 | Kudo | 310/348 |
| 4,451,754 | 5/1984 | Stolz et al. | 310/348 |
| 4,469,975 | 9/1984 | Nakamura et al. | 310/321 |

Primary Examiner—Patrick R. Salce
Assistant Examiner—Emanuel Todd Voeltz
Attorney, Agent, or Firm—Wenderoth, Lind & Ponack

[57] ABSTRACT

In a piezoelectric vibrator capable of vibrating under an expansion mode of vibration, which has a piezoelectric vibrating element including a generally rectangular vibrateable substrate, made of a metallic material having a constant modulus of elasticity. The substrate is supported by a retaining member through a pair of connecting elements which extend outwardly from an arbitrarily chosen pair of side edges, respectively, so as to terminate in rigid connection with the retaining member. The width of each of the connecting elements as measured in a direction lengthwise of each of said edges is selected to be within the range of 1/7 to ⅓ of the length of said each side edge.

3 Claims, 7 Drawing Figures

PIEZOELECTRIC VIBRATOR

BACKGROUND OF THE INVENTION

The present invention generally relates to a piezoelectric vibrator comprising a generally parallelogrammical piezoelectric vibrating element including a vibrateable substrate made of a constant elastic metal, i.e., a metallic material having a constant modulus of elasticity, and, more particularly, to the support of the piezoelectric vibrating element by a retaining means through a pair of connecting elements.

The piezoelectric vibrator of the type referred to above is well known in the art. In this known piezoelectric vibrator, in order for the vibration induced in the peizoelectric vibrating element not to be suppressed, or otherwise adversely affected, by the connecting elements used to connect it to the retaining means, the width of each of the connecting elements as measured in a direction parallel to the lengthwise direction of one or two pairs of sides of the shape of the piezoelectric vibrating element, for example, the lengthwise direction of each of the paired shorter sides in the case where the piezoelectric vibrating element is of rectangular shape, is customarily selected to be of a small value as compared with the length of each of such paired shorter sides. It is generally recognized that the smaller the width of each connecting element, the better.

However, it has been found that the prior art piezoelectric vibrator wherein the width of each connecting element is smaller than one tenth of the length of each shorter side of the piezoelectric vibrating element tends to produce, as shown in FIG. 5 of the accompanying drawings, not only a requisite expansion vibration A propagating in a direction parallel to the respective shorter side of the piezoelectric element, but also such unwanted vibrations as flexure vibration B propagating in a direction lengthwise of the shorter side, an expansion vibration C propagating in a direction lengthwise of the longer sides and Lamb wave D, with the result that the vibrating characteristic thereof is lowered.

In view of the foregoing, the piezoelectric vibrator is fabricated into a bimorph structure comprising, as shown in FIG. 6 of the accompanying drawings, a vibrateable substrate 01 having its opposite surfaces provided with a respective thin film 02 of piezoelectric material and a respective exciting electrode layer 03 overlaid on the associated piezoelectric thin film 02, the exciting electrode layers 03 being adapted to be connected to a source 04 of drive current in parallel, but reverse-biased relation to each other so that the applied voltage can cause the piezoelectric thin films 02 to flex in the opposite directions with respect to each other. In this way, the flexure vibration can be counteracted thereby to minimize the generation of the unwanted vibrations.

Fabrication of the piezoelectric vibrator so as to have a bimorph structure has been found to result in an increased amount of material required as well as an increased number of manufacturing process steps which in turn often constitutes a cause of deviation in design dimension from one piezoelectric vibrator to another.

SUMMARY OF THE INVENTION

The present invention has been developed with a view to substantially eliminating the above described disadvantages and inconveniences inherent in the prior art piezoelectric vibrators and has for its essential object to provide an improved piezoelectric vibrator which is simple in structure and can be manufactured with the use of a minimum number of manufacturing process steps, and yet which is effective to minimize the generation of unwanted vibrations.

To this end, the present invention provides a piezoelectric vibrator of the type first referred to above, wherein the width of each connecting element is selected to be one seventh (1/7) to one third (1/3) of the length of each of an arbitrarily chosen pair of sides of the piezoelectric vibrating element.

The present invention is based on the finding that the flexure vibration occurring in a direction lengthwise of each of the arbitrarily chosen pair of the sides of the piezoelectric vibrating element has been affected by the support system for supporting the piezoelectric vibrating element relative to the retaining means and has been invited because the support system lacked a sufficient physical strength. Therefore, the present invention has the feature that the width of each of the connecting elements is so selected as hereinbefore described thereby to minimize the occurrence of flexure vibration without the expansion mode of vibration being adversely affected.

More specifically, by selecting the minimum width of each connecting element to be equal to or greater than one seventh of the length of the arbitrarily chosen pair of the sides of the piezoelectric vibrating element, the piezoelectric vibrating element can be advantageously firmly supported by the retaining means through the connecting elements enough to substantially avoid any possible flexure in a direction lengthwise of the arbitrarily chosen pair of the sides of the piezoelectric vibrating element relative to the retaining means, and, hence, to minimize the flexure vibration which would occur in the piezoelectric vibrating element in said direction. On the other hand, by selecting the maximum width of each connecting element to be equal to or smaller than one third of the length of the arbitrarily chosen pair of the sides of the vibrating element, an undesirable suppression of the expansion vibration in a direction lengthwise of the arbitrarily chosen pair of the sides of the piezoelectric vibrating element due to the connecting elements can advantageously be avoided.

In summary, according to the present invention, the mere, but reasonable, selection of a particular value for the width of each connecting element effectively results in a simple, easy-to-manufacture and less costly piezoelectric vibrator effective to suppress the unwanted vibration. Moreover, since the support system provided by the connecting elements can be strengthened, the piezoelectric vibrator according to the present invention can have an increased resistance to both shock and impact.

BRIEF DESCRIPTION OF THE DRAWINGS

This and other objects and features of the present invention will become apparent from the following description taken in conjunction with a preferred embodiment thereof with reference to the accompanying drawings, in which.

DETAILED DESCRIPTION OF THE INVENTION

Figure 1:
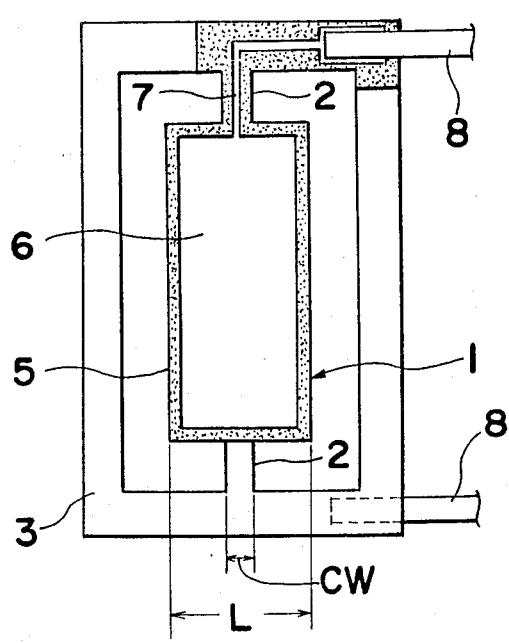
FIGS. 1 and 2 are top plan and perspective views of a piezoelectric vibrating element used in a piezoelectric vibrator embodying the present invention, respectively.
Figure 6:
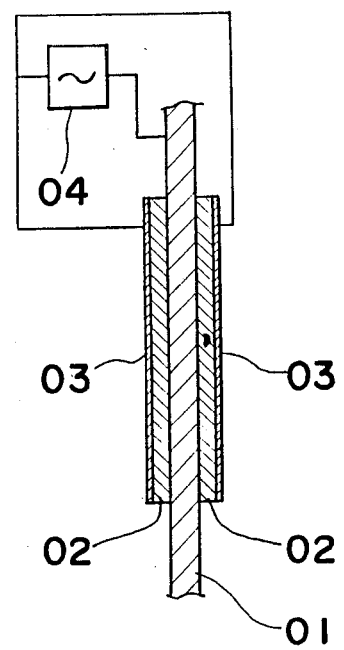
FIG. 6 is a schematic sectional view of the prior art bimorph structure.
Figure 2:
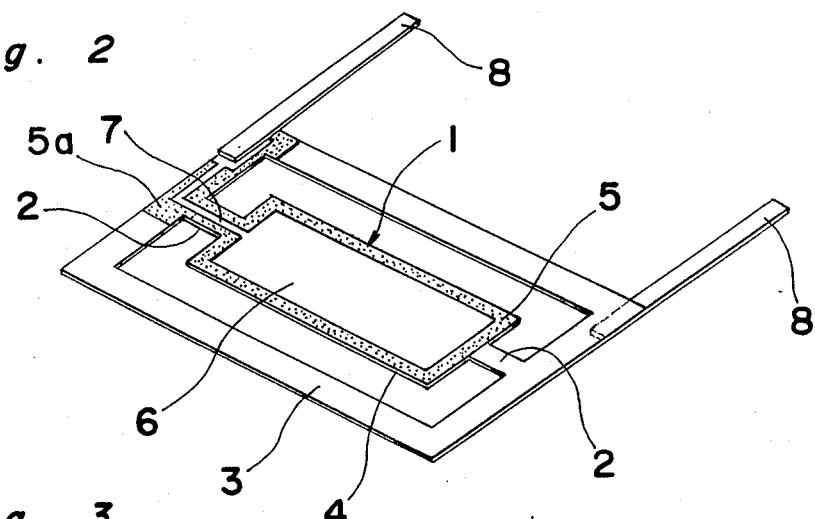
Figure 3:
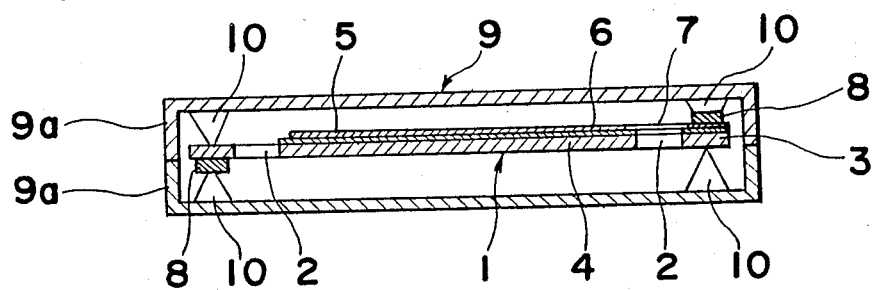
FIG. 3 is a longitudinal sectional view of the piezoelectric vibrator with the piezoelectric vibrating element encased in a casing.

Referring to FIGS. 1 to 3, a piezoelectric vibrator embodying the present invention comprises a generally rectangular box-like casing 9 composed of substantially identical casing halves 9a each having a generally rectangular plate and a peripheral wall protruding from the rectangular periphery of the respective plate at right angles thereto.

A right angled parallelogram shaped piezoelectric vibrating element 1, here shown as generally rectangular, is supported by a similarly shaped retaining member 3 by means of a pair of connecting strips 2 protruding from the opposite ends of the vibrating element 1 in the opposite directions away from said element 1, respectively, said connecting strips 2 being in line with each other and also with the longitudinal axis of the vibrating element 1. This vibrating element 1 compresses a vibrateable substrate 1 having deposited on one planar surface thereof a thin film 5 of piezoelectric material, for example, ZnO, by the use of any known sputtering technique, and an exciting electrode layer 6 deposited on one surface of the piezoelectric thin film 5 opposite to the substrate 4 by the use of any known vapor deposition technique, said electrode layer 6 being preferably made of Al, Ag, Au or Ni.

The connecting strips 2, the retaining member 3 and the vibrateable substrate 4 are of unitary structure formed by the use of any suitable method, for example, a press work, of a constant elastic metallic material having a constant modulus of elasticity such as, for example, Elinvar, Invar, Anver, or Co-elinvar.

At the time of the deposition of the piezoelectric thin film 5 on the substrate 4, an extension 5a of the piezoelectric thin film 5 is also formed so as to extend from the thin film 5 along one of the connecting strips 2 and terminate at one of the four corner areas of the frame member 3. Similarly, at the time of deposition of the electrode layer 6, an extension of the electrode layer 6 is formed so as to extend from the electrode layer 6 along said one of the connecting strips 2 and over the extension 5a of the thin film 5 and terminate at said one of the corner areas of the frame member 3 thereby defining a lead-out electrode 7. Two elongated terminal members 8 for electrical connection of the piezoelectric vibrator with an external circuit are rigidly connected, for example, soldered, to the free end of the lead-out electrode 7 and one of the other corner areas of the retaining member 3.

The assembly, i.e., the unitary structure of substrate 4, connecting strips 2 and frame member 3 with the piezoelectric thin film 5 and electrode layer 6, is encased within the casing 9 as shown in FIG. 3. As shown, each of the casing halves 9a has four conical projections 10 protruding inwardly from the respective rectangular plate at respective location corresponding to the four corner areas of the frame member 3 such that, within the interior of the casing 9, the assembly is supported by a point support system while the four corner areas of the frame member 3 are sandwiched between tips of the respectively paired conical projections 10. The casing halves 9a are bonded together to provide the casing 1 with the assembly therein in any suitable manner.

In the illustrated embodiment, the width CW of each of the connecting strips 2 is selected to be one fifth of the length L of each of the opposite shorter sides of the shape of the piezoelectric vibrating element 1. By way of example, if the length L is chosen to be 800 μm, the width CW may be 160 μm.

Hereinafter, the results of experiments conducted to determine the vibrating characteristic will be described with particular reference to FIG. 4.

Figure 4:
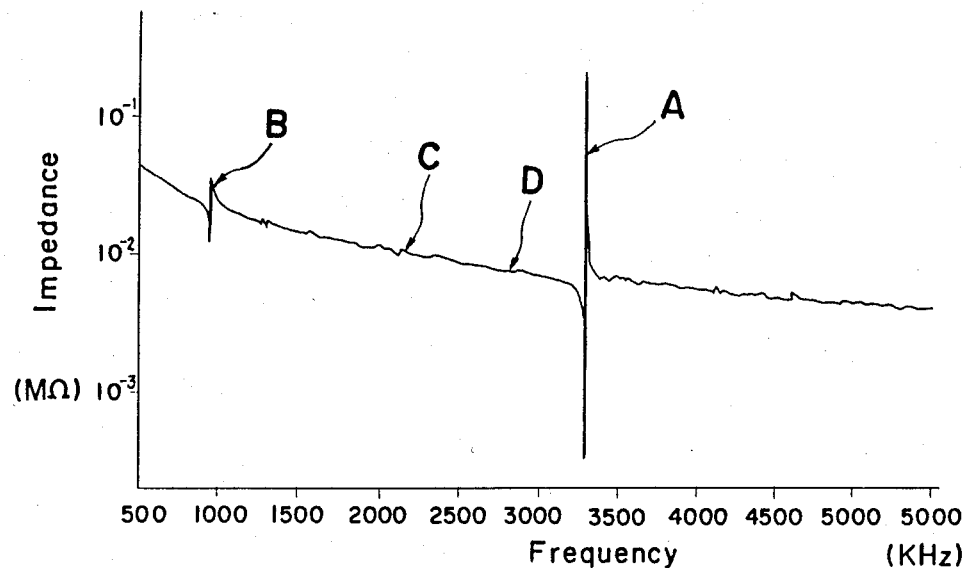
FIGS. 4 and 5 are graphs showing the respective relationship between impedance and frequency exhibited by the piezoelectric vibrator of the present invention and the prior art one.
Figure 5:
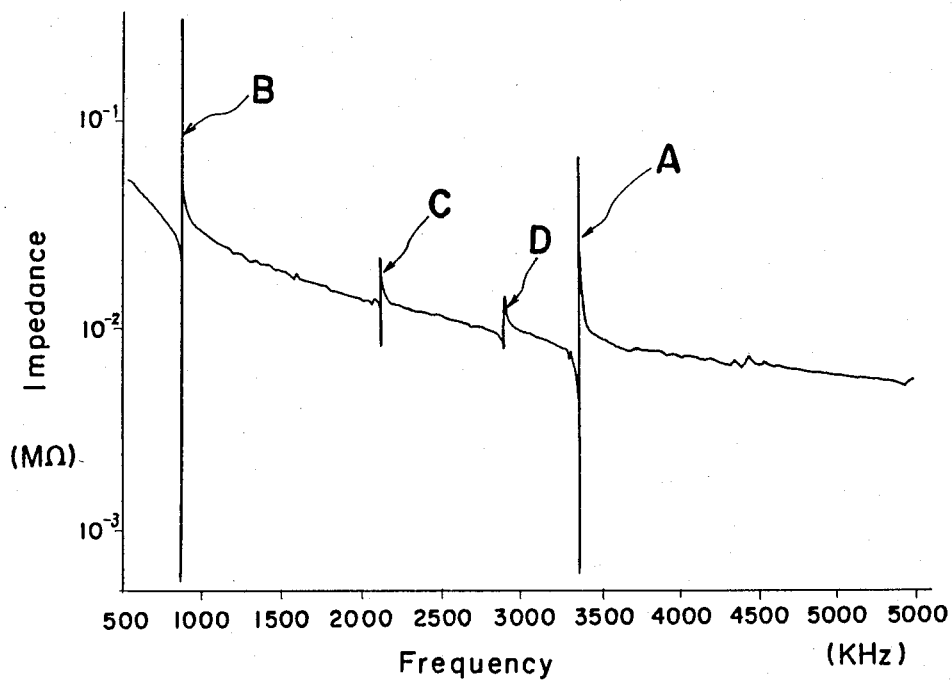

When the impedance characteristic relative to change in oscillating frequency was examined, a graph as shown in FIG. 4 was obtained wherein the axis of abscissa and the axis of ordinate represent the oscillating frequency and the impedance, respectively. When compared with the graph of FIG. 5, the graph of FIG. 4 shows that, while the expansion vibration A in the direction lengthwise of each of the shorter sides of the piezoelectric vibrating element 1 is similar to that in the graph of FIG. 5, the flexure vibration B in such direction has been considerably suppressed and, at the same time, the expansion vibration C in the direction lengthwise of each of the longer sides thereof as well as Lamb wave D have been substantially eliminated. Thus, it has now become clear that the present invention is effective to minimize, or substantially eliminate, the generation of unwanted vibrations, with the vibrating characteristic improved.

In the practice of the present invention, the width CW may be within the range of 1/7 to ⅓ of the length L. It has been found that, when the ratio of the width CW relative to the length L is not greater than 1/7, the flexure vibration B occurs considerably, but when the ratio of CW/L is not smaller than ⅓, the expansion vibration A in the direction lengthwise of each shorter side of the piezoelectric vibrating element 1 tends to be reduced. Accordingly, in the practice of the present invention, the above described range is preferred.

Figure 7:
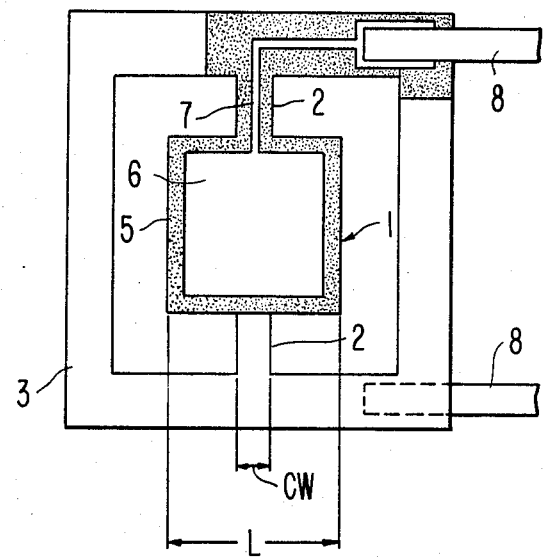
FIG. 7 is a view similar to FIG. 1 showing a further embodiment.

Although the present invention has been fully described in connection with the preferred embodiment thereof with reference to the accompanying drawings, it is to be noted that various changes and modifications will be apparent to those skilled in the art without departing from the scope thereof as defined by the appended claims. By way of example, although the piezoelectric vibrating element in the illustrated embodiment has been shown and described as having a rectangular shape, it may have any right angle parallelogram shape, such as a square shape, as shown in FIG. 7 a shape similar to the shape of a tie bow or butterfly, or any other shape so far as the piezoelectric vibrating element has at least four corners. Therefore, the term "generally angle parallelogram shape" herein used in connection with the shape of the piezoelectric vibrating element is to be understood as including any of these shapes.

Accordingly, such changes and modifications are to be understood as being included within the scope of the present invention.

What is claimed is:

1. In a piezoelectric vibrator capable of vibrating under an expansion mode of vibration, which includes a piezoelectric vibrating element having a generally right angled parallelogram-shaped vibrateable substrate, made of a metallic material having a constant modulus of elasticity, said substrate being supported by a retaining means through a pair of connecting elements which extend outwardly from an arbitrarily chosen pair of side edges, respectively, so as to terminate in rigid connection with the retaining means, the improvement comprising: the width of each of the connecting elements as measured in a direction lengthwise of each of said side edges being selected to be within the range of 1/7 to ⅓ of the length of said each side edge.

2. A piezoelectric vibrator as claimed in claim 1, wherein the piezoelectric vibrating element is square in shape.

3. A piezoelectric vibrator as claimed in claim 1, wherein the piezoelectric vibrating element is rectangular in shape and said pair of the side edges are the opposite ends of the piezoelectric vibrating element.

* * * * *